(12) United States Patent  
Fujisawa et al.

(10) Patent No.: US 12,183,819 B2  
(45) Date of Patent: Dec. 31, 2024

(54) SILICON CARBIDE SEMICONDUCTOR DEVICE

(71) Applicant: FUJI ELECTRIC CO., LTD., Kawasaki (JP)

(72) Inventors: Hiroyuki Fujisawa, Matsumoto (JP); Akimasa Kinoshita, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 18/170,938

(22) Filed: Feb. 17, 2023

(65) Prior Publication Data

US 2023/0207680 A1 Jun. 29, 2023

Related U.S. Application Data

(62) Division of application No. 17/158,552, filed on Jan. 26, 2021, now Pat. No. 11,610,990.

(30) Foreign Application Priority Data

Mar. 17, 2020 (JP) ................. 2020-046991

(51) Int. Cl.  
*H01L 29/78* (2006.01)  
*H01L 29/06* (2006.01)  
(Continued)

(52) U.S. Cl.  
CPC ...... *H01L 29/7808* (2013.01); *H01L 29/0696* (2013.01); *H01L 29/1045* (2013.01); *H01L 29/7813* (2013.01); *H01L 29/1608* (2013.01)

(58) Field of Classification Search  
CPC ............. H01L 29/7808; H01L 29/0696; H01L 29/1045; H01L 29/7813; H01L 29/1608;  
(Continued)

(56) References Cited

U.S. PATENT DOCUMENTS

2018/0033876 A1 2/2018 Sugahara et al.  
2018/0033885 A1 2/2018 Okumura et al.  
(Continued)

FOREIGN PATENT DOCUMENTS

JP H11-345969 A 12/1999  
JP 2018-019045 A 2/2018  
(Continued)

OTHER PUBLICATIONS

Japanese Office Action dated Dec. 26, 2023, in the counterpart Japanese Patent Application 2020-046991.

*Primary Examiner* — Cuong B Nguyen  
(74) *Attorney, Agent, or Firm* — Rabin & Berdo, P.C.

(57) ABSTRACT

A semiconductor device includes a semiconductor substrate of a first conductivity type, a first semiconductor layer of the first conductivity type, a second semiconductor layer of a second conductivity type, first semiconductor regions of the first conductivity type, second semiconductor regions of the second conductivity type, gate insulating films, gate electrodes, an insulating film, first electrodes, a second electrode, and trenches. The first semiconductor regions and the second semiconductor regions are periodically disposed apart from one another in a first direction in which the trenches extend in a stripe pattern.

19 Claims, 11 Drawing Sheets

(51) Int. Cl.
  *H01L 29/10*    (2006.01)
  *H01L 29/16*    (2006.01)
(58) Field of Classification Search
  CPC ............. H01L 29/0878; H01L 29/0623; H01L
      29/66068; H01L 29/7805; H01L 29/7827;
        H01L 27/0629; H01L 29/0684; H01L
              29/1037; H01L 29/4236
  See application file for complete search history.

(56) References Cited

U.S. PATENT DOCUMENTS

| | | | |
|---|---|---|---|
| 2018/0182884 A1 | 6/2018 | Kobayashi et al. | |
| 2019/0245075 A1* | 8/2019 | Aichinger | ........... H01L 29/7813 |
| 2019/0305079 A1 | 10/2019 | Osuga et al. | |
| 2021/0288156 A1* | 9/2021 | Fukui | .................. H01L 29/1095 |

FOREIGN PATENT DOCUMENTS

| JP | 2018-019046 A | 2/2018 |
|---|---|---|
| JP | 2019175930 A | 10/2019 |
| JP | 2019-216224 A | 12/2019 |

* cited by examiner

SILICON CARBIDE SEMICONDUCTOR DEVICE

CROSS REFERENCE TO RELATED APPLICATIONS

This application is a divisional of U.S. application Ser. No. 17/158,552, filed on Jan. 26, 2021 and is based upon and claims the benefit of priority of the prior Japanese Patent Application No. 2020-046991, filed on Mar. 17, 2020, the entire contents of which are incorporated herein by reference.

BACKGROUND OF THE INVENTION

1. Field of the Invention

Embodiments of the invention relate to a silicon carbide semiconductor device.

2. Description of the Related Art

Silicon carbide (SiC) is expected to replace silicon (Si) as a next generation semiconductor material. Compared to a conventional semiconductor device in which silicon is used as a semiconductor material, a semiconductor device in which silicon carbide is used as a semiconductor material (hereinafter, silicon carbide semiconductor device) has various advantages as such as enabling use under higher temperature environments (at least 200 degrees C.) and reducing device resistance in an ON state to one of a few hundredths of that of the conventional semiconductor device. These advantages are due to characteristics of the material itself such as the bandgap of silicon carbide being about three times that of silicon and dielectric breakdown electric field strength being nearly ten times greater than that of silicon.

As silicon carbide semiconductor devices, Schottky barrier diodes (SBDs) and vertical metal oxide semiconductor field effect transistors (MOSFETs) having a planar gate structure or a trench gate structure have been made into products.

A trench gate structure is a MOS gate structure in which a MOS gate is embedded in a trench formed in a semiconductor substrate (semiconductor chip) at a front surface of the semiconductor substrate and in which a channel (inversion layer) is formed along sidewalls of the trench, in a direction orthogonal to the front surface of the semiconductor substrate. Therefore, compared to a planar gate structure in which a channel is formed along the front surface of the semiconductor substrate, unit cell (constituent unit of a device element) density per unit area may be increased and current density per unit area may be increased, which is advantageous in terms of cost. A planar gate structure is a MOS gate structure in which a MOS gate is provided in a flat plate-like shape on the front surface of a semiconductor substrate.

A structure of a conventional silicon carbide semiconductor device is described taking a trench-type MOSFET as an example (for example, refer to Japanese Laid-Open Patent Publication No. 2018-019045 and Japanese Laid-Open Patent Publication No. 2018-019046). FIG. 17 is a cross-sectional view of the structure of the conventional silicon carbide semiconductor device. As depicted in FIG. 17, in a trench-type MOSFET 150, an n-type silicon carbide epitaxial layer 102 is deposited on a front surface of an $n^+$-type silicon carbide substrate 101. On a surface of the n-type silicon carbide epitaxial layer 102, opposite a surface thereof facing the $n^+$-type silicon carbide substrate 101, an n-type high-concentration region 106 is provided. Further, in the n-type high-concentration region 106 at a surface thereof opposite that facing the $n^+$-type silicon carbide substrate 101, first $p^+$-type base regions 104 are selectively provided. In the n-type high-concentration region 106, second $p^+$-type base regions 105 are selectively provided so as to underlie an entire area of a bottom of each of the trenches 118.

Further, in the trench-type MOSFET 150, a p-type silicon carbide epitaxial layer 103, $n^+$-type base regions 107, $p^{++}$-type contact regions 108, gate insulating films 109, gate electrodes 110, an insulating film 111, source electrodes 113, a back electrode 114, the trenches 118, a source electrode pad (not depicted), and a drain electrode pad (not depicted) are further provided. The source electrodes 113 are provided on the $n^+$-type base regions 107 and the $p^{++}$-type contact regions 108, and the source electrode pad is provided on the source electrodes 113.

SUMMARY OF THE INVENTION

According to an embodiment of the invention, a semiconductor device includes a semiconductor substrate of a first conductivity type, having a front surface and a back surface that are opposite to each other; a first semiconductor layer of the first conductivity type, provided on the front surface of the semiconductor substrate and having an impurity concentration lower than an impurity concentration of the semiconductor substrate, the first semiconductor layer having a first surface and a second surface that are opposite to each other, the second surface facing the semiconductor substrate; a second semiconductor layer of a second conductivity type, selectively provided on the first surface of the first semiconductor layer and having a first surface and a second surface that are opposite to each other, the second surface facing the semiconductor substrate; a plurality of first semiconductor regions of the first conductivity type, selectively provided in the second semiconductor layer at the first surface thereof; a plurality of second semiconductor regions of the second conductivity type, selectively provided in the second semiconductor layer at the first surface thereof; a plurality of trenches arranged in a stripe-shape, each penetrating the second semiconductor layer and reaching the first semiconductor layer; a plurality of gate electrodes, each of which is provided in a respective one of the plurality of trenches via a gate insulating film; a first electrode provided on respective surfaces of the second semiconductor layer, the first semiconductor regions, and the second semiconductor regions; and a second electrode provided on the back surface of the semiconductor substrate. The first semiconductor regions and the second semiconductor regions are periodically disposed apart from one another in a first direction in which the plurality of trenches extend in the stripe-shape.

Objects, features, and advantages of the present invention are specifically set forth in or will become apparent from the following detailed description of the invention when read in conjunction with the accompanying drawings.

DETAILED DESCRIPTION OF THE INVENTION

Figure 17:
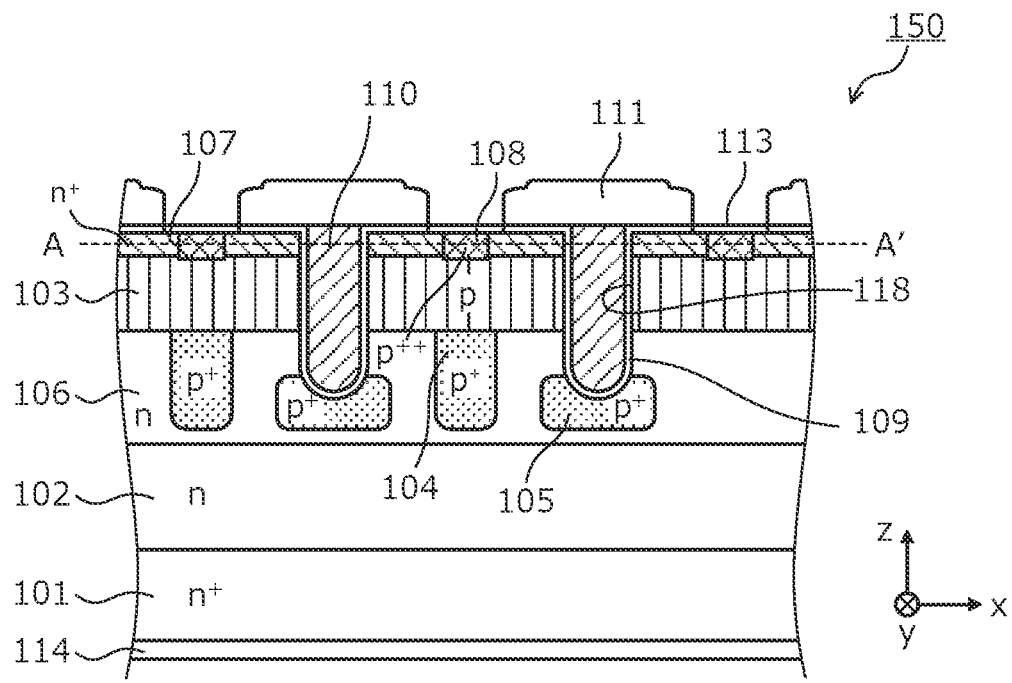
FIG. 17 is a cross-sectional view of a structure of a conventional silicon carbide semiconductor device.
Figure 18:
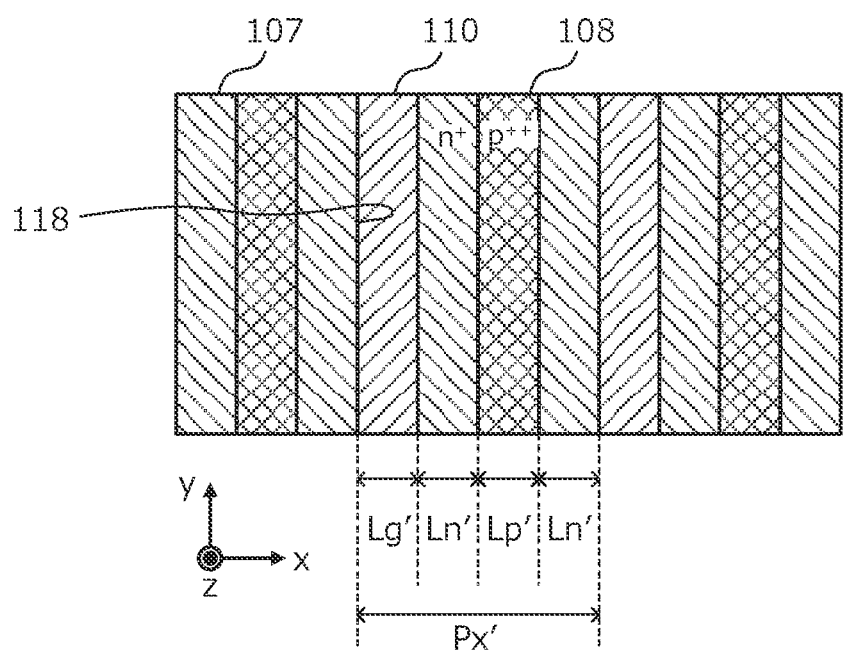
FIG. 18 is a plan view of the structure of the conventional silicon carbide semiconductor device along cutting line A-A' in FIG. 17.

First, problems associated with the conventional techniques are described. FIG. 18 is a plan view of the structure of the conventional silicon carbide semiconductor device along cutting line A-A' in FIG. 17. As depicted in FIG. 18, the trenches 118 are provided in a stripe pattern and between the trenches 118, one of the n$^+$-type base regions 107, one of the p$^{++}$-type contact regions 108, and one of the n$^+$-type base regions 107 are provided in the order stated, in a stripe pattern.

The p$^{++}$-type contact regions 108 are necessary for maintaining the p-type silicon carbide epitaxial layer 103 at a potential equal to that of the source electrodes 113. In the conventional silicon carbide semiconductor device, the p-type silicon carbide epitaxial layer 103 and the source electrodes 113 are maintained at potentials equal to one another by the p$^{++}$-type contact regions 108 sandwiched between the n$^+$-type base regions 107 in a stripe pattern.

Nonetheless, in the structure in which one of the n$^+$-type base regions 107, one of the p$^{++}$-type contact regions 108, and one of the n$^+$-type base regions 107 are provided sequentially between the trenches 118, there is a limit to the extent to which cell pitch may be reduced and channel width density may be enhanced.

Embodiments of a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or − Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
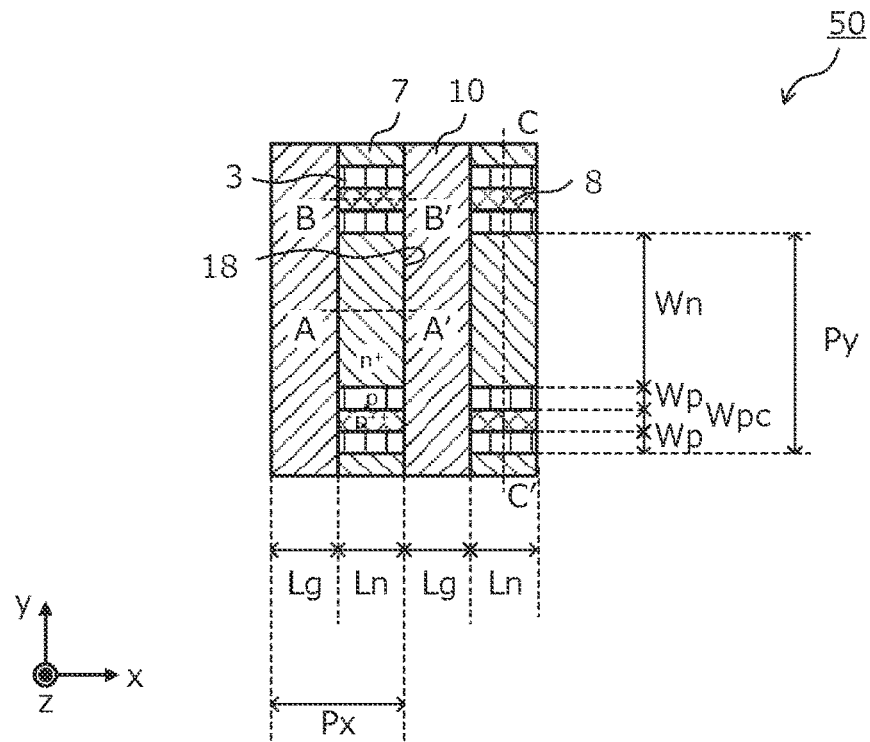
FIG. 1 is a plan view of a silicon carbide semiconductor device according to a first embodiment.
Figure 2:
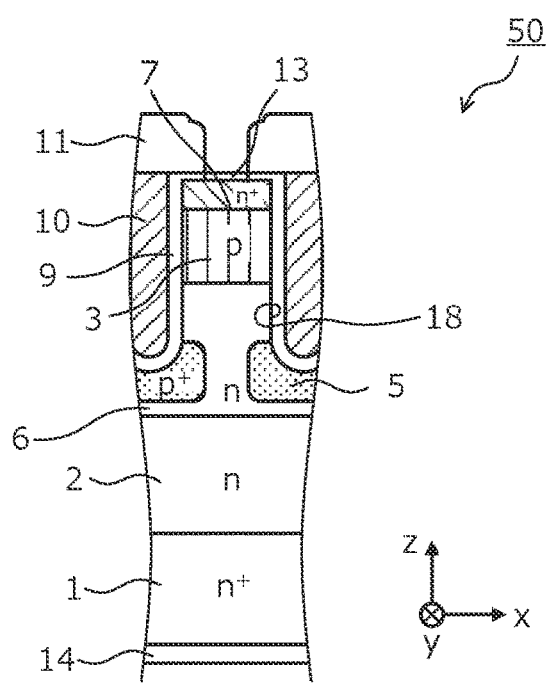
FIG. 2 is a cross-sectional view of a structure of the silicon carbide semiconductor device according to the first embodiment along cutting line A-A' in FIG. 1.
Figure 3:
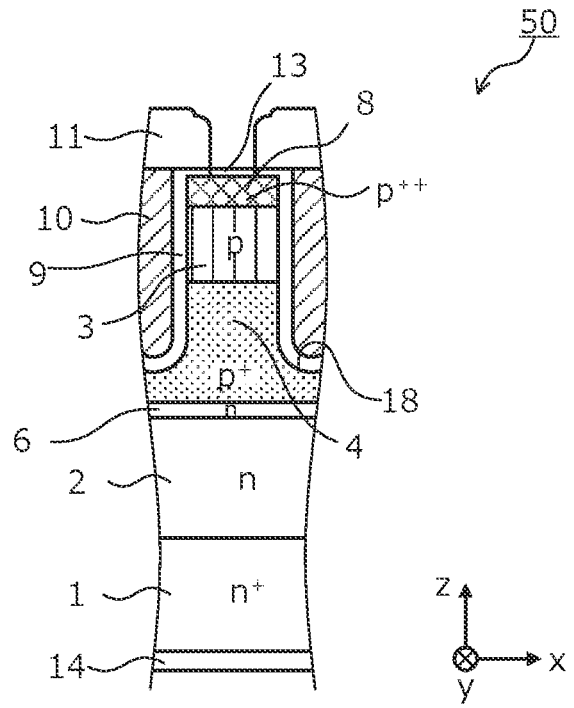
FIG. 3 is a cross-sectional view of the structure of the silicon carbide semiconductor device according to the first embodiment along cutting line B-B' in FIG. 1.
Figure 4:
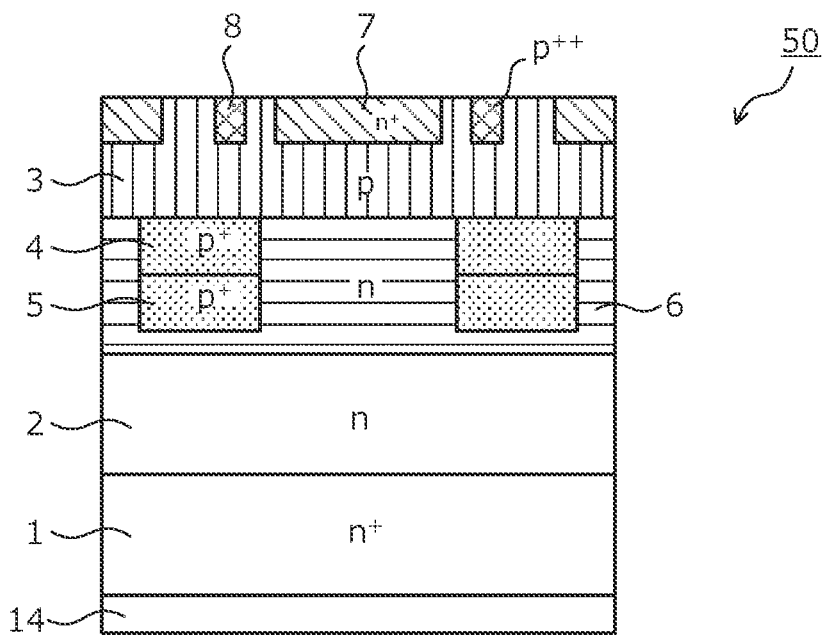
FIG. 4 is a cross-sectional view of the structure of the silicon carbide semiconductor device according to the first embodiment along cutting line C-C' in FIG. 1.

A semiconductor device according to a first embodiment contains a semiconductor having a bandgap wider than that of silicon (Si) (wide bandgap semiconductor). A structure of the semiconductor device according to the first embodiment is described taking, as an example, an instance in which silicon carbide (SiC) is used as a wide bandgap semiconductor. FIG. 1 is a plan view of a silicon carbide semiconductor device according to the first embodiment. FIG. 2 is a cross-sectional view of the structure of the silicon carbide semiconductor device according to the first embodiment along cutting line A-A' in FIG. 1. FIG. 3 is a cross-sectional view of the structure of the silicon carbide semiconductor device according to the first embodiment along cutting line B-B' in FIG. 1. FIG. 4 is a cross-sectional view of the structure of the silicon carbide semiconductor device according to the first embodiment along cutting line C-C' in FIG. 1.

As depicted in FIGS. 2 to 4, a trench-type MOSFET 50 includes MOS gates having a trench gate structure and provided on a front surface (surface having a p-type silicon carbide epitaxial layer 3 described hereinafter) of a semiconductor substrate. A silicon carbide semiconductor base is formed by sequentially forming an n-type silicon carbide epitaxial layer (first semiconductor layer of a first conductivity type) 2 and the p-type silicon carbide epitaxial layer (second semiconductor region of a second conductivity type) 3 by epitaxial growth on an n$^+$-type silicon carbide substrate (semiconductor substrate of the first conductivity type) 1 containing silicon carbide. Further, an n-type high-concentration region 6 may be epitaxially grown on the n-type silicon carbide epitaxial layer 2.

The MOS gates having the trench gate structure are configured by the p-type silicon carbide epitaxial layer 3, n$^+$-type source regions (first semiconductor regions of the first conductivity type) 7, p$^{++}$-type contact regions (second semiconductor regions of the second conductivity type) 8, trenches 18, gate insulating films 9, and gate electrodes 10.

In particular, the trenches 18 penetrate the p-type silicon carbide epitaxial layer 3 in a depth direction z from the front surface of the semiconductor substrate and reach the n-type high-concentration region 6 (in an instance in which the n-type high-concentration region 6 is not provided, the n-type silicon carbide epitaxial layer 2, hereinafter, simply "(2)"). The depth direction z is a direction from the front surface of the semiconductor substrate toward a back surface thereof. The trenches 18 are disposed in a stripe pattern.

In each of the trenches 18, one of the gate insulating films 9 is provided along an inner wall of the trench 18 and one of the gate electrodes 10 is provided on the gate insulating film 9, so as to be embedded in the trench 18. One unit cell of a main semiconductor device is configured by the gate electrode 10 in one of the trenches 18 and adjacent mesa regions sandwiching the gate electrode 10 (a mesa region being the region between adjacent trenches 18 of the trenches 18. In FIGS. 2 and 3, while only one MOS structure is depicted, more MOS gate structures (insulated gates formed by a metal, an oxide film, and a semiconductor) having a trench structure may be further disposed in parallel.

An n-type region (hereinafter, n-type high-concentration region) 6 may be provided in a surface layer of the n-type silicon carbide epitaxial layer 2 on a source side thereof (side facing source electrodes 13 described hereinafter), the n-type high-concentration region 6 being provided so as to be in contact with the p-type silicon carbide epitaxial layer 3. The n-type high-concentration region 6 is a so-called current spreading layer (CSL) that reduces carrier spreading resistance. The n-type high-concentration region 6, for example, is provided uniformly in a direction parallel to a substrate front surface (the front surface of the semiconductor substrate) so as to be exposed at inner walls of the trenches 18.

The n-type high-concentration region 6, from a border thereof with the p-type silicon carbide epitaxial layer 3, reaches a position deeper on a drain side (closer to a back electrode 14 described hereinafter) than do bottoms of the trenches 18. In the n-type high-concentration region 6, first and second $p^+$-type base regions 4, 5 may be selectively provided. The first $p^+$-type base regions 4 are included in the second semiconductor region of the second conductivity type. That is, the second semiconductor region is provided in a mesa region that is between an adjacent two trenches 18. The second semiconductor region in each mesa region is constituted by a plurality of $p^{++}$-type contact regions 8, a part of the p-type silicon carbide epitaxial layer 3, and a plurality of first $p^+$-type base regions 4. The plurality of $p^{++}$-type contact regions 8 included in the second semiconductor region in each mesa region are selectively provided in a surface layer of the p-type silicon carbide epitaxial layer 3 and apart from one another in a y-direction (first direction). The plurality of first $p^+$-type base regions 4 included in the second semiconductor region in each mesa region can be selectively provided in the n-type silicon carbide epitaxial layer 2 or the n-type high-concentration region 6, apart from one another in the y-direction, and each extend from a bottom of the part of the p-type silicon carbide epitaxial layer 3 to a top of a corresponding second $p^+$-type base region 5 in the depth direction z. That is, the second semiconductor region in each mesa region may include $p^{++}$-type contact regions 8 and/or first $p^+$-type base regions 4, as a plurality of portions of the second semiconductor region that are periodically provided in the y-direction.

As shown in FIG. 4, the second semiconductor region includes upper portions that are each constituted by a part of the p-type silicon carbide epitaxial layer 3 and the $p^{++}$-type contact region 8 and that are periodically exposed from the first main surface of the semiconductor base. As explained later, on the top surface of the silicon carbide semiconductor base, in the y-direction, an interval of an adjacent two upper portions of the second semiconductor region corresponds to a length of each $n^+$-type source region 7 in the y-direction, which is shown as Wn in FIG. 1. A length of each upper portion of the second semiconductor region corresponds to an interval of an adjacent two $n^+$-type source regions 7 that are adjacent in the y-direction, which is Py-Wn in FIG. 1.

The first $p^+$-type base regions 4 are provided between adjacent trenches 18 of the trenches 18 (mesa region) to be in contact with the second $p^+$-type base regions 5 and the trenches 18 and the p-type silicon carbide epitaxial layer 3. Of the bottoms and bottom corner portions of the trenches 18, the second $p^+$-type base regions 5 underlie at least the bottoms of the trenches 18. The bottom corner portions of the trenches 18 are borders between the bottoms and sidewalls of the trenches 18.

Pn junctions between the first and the second $p^+$-type base regions 4, 5 and the n-type silicon carbide epitaxial layer 2 are formed at deep positions closer to the back electrode 14 than are the bottoms of the trenches 18. In an instance in which the n-type high-concentration region 6 is not provided, the first and the second $p^+$-type base regions 4, 5 may be formed in the n-type silicon carbide epitaxial layer 2. Depth positions of ends of the first and the second $p^+$-type base regions 4, 5 facing the back electrode 14 suffice to be such that the pn junctions between the first and the second $p^+$-type base regions 4, 5 and the n-type silicon carbide epitaxial layer 2 are at deep positions closer to the back electrode 14 than are the bottoms of the trenches 18 and may be variously changed according to design conditions. Application of high electric field to the gate insulating films 9 at portions along the bottoms of the trenches 18 is prevented by the first and the second $p^+$-type base regions 4, 5.

The $n^+$-type source regions 7 are selectively provided in the p-type silicon carbide epitaxial layer 3. The $p^{++}$-type contact regions 8 are selectively provided apart from the $n^+$-type source regions 7, separated by an interval. The $n^+$-type source regions 7 are in contact with the gate insulating films 9 at the sidewalls of the trenches 18 and face the gate electrodes 10 with the gate insulating films 9 of the trenches 18 respectively intervening therebetween.

An insulating film 11 is provided in an entire area of the front surface of the semiconductor substrate so as to cover the gate electrodes 10. In the insulating film 11, contact holes are opened penetrating through the insulating film 11 in the depth direction z and reaching the substrate from surface.

The source electrodes (first electrodes) 13 are in ohmic contact with the semiconductor substrate (the $n^+$-type source regions 7) in the contact holes and are electrically insulated from the gate electrodes 10 by the insulating film 11. A source electrode pad (not depicted) is provided on the source electrodes 13. In an instance in which the $p^{++}$-type contact regions 8 are provided, the source electrodes 13 are in ohmic contact with the $p^{++}$-type contact regions 8.

The back electrode (second electrode) 14 that forms a drain electrode is provided on the back surface of the semiconductor substrate. A drain electrode pad (not depicted) is provided on the back electrode 14.

Here, in the first embodiment, as depicted in FIG. 1, the trenches 18 extend in a stripe pattern in a y-direction (first direction) and are arranged in plural in an x-direction (second direction) that is orthogonal to the y-direction and parallel to a front surface of the $n^+$-type silicon carbide substrate. The $n^+$-type source regions 7 and the $p^{++}$-type contact regions 8 are provided between the trenches 18 so as to be in contact with the trenches 18 in the x-direction and to be periodically disposed, apart from one another in the y-direction.

The $n^+$-type source regions 7 and the $p^{++}$-type contact regions 8 are disposed in this manner, whereby widths of the n+-type source regions 7 and of the p++-type contact regions 8 may be reduced, thereby enabling reduction of the cell pitch (distance between the trenches 18). Therefore, the silicon carbide semiconductor device according to the first embodiment may enhance the channel width density per unit area and reduce the ON resistance.

Further, intervals are provided between the n+-type source regions 7 and the p++-type contact regions 8 and in the intervals, the p-type silicon carbide epitaxial layer 3 is exposed. The y-direction is an off-angle direction of the n+-type silicon carbide substrate 1 and therefore, a position of an ion implantation mask easily shifts. When the position of the ion implantation mask shifts and as a result, the n+-type source regions 7 and the p++-type contact regions 8 overlap one another, point defects occur and gate reliability decreases.

In the first embodiment, by providing the intervals between the n+-type source regions 7 and the p++-type contact regions 8, overlapping of the n+-type source regions 7 and the p++-type contact regions 8 may be prevented even when the position of the ion implantation mask shifts when the n+-type source regions 7 or the p++-type contact regions 8 are formed. Therefore, the occurrence of point defects due to overlapping of the n+-type source regions 7 and the p++-type contact regions 8 may be prevented and the gate reliability may be enhanced.

Further, the positions of the respective ion implantation masks of the n+-type source regions 7 and the p++-type contact regions 8 may shift about 0.2 μm. Furthermore, regions of the n+-type source regions 7 and the p++-type contact regions 8 may spread about 0.3 μm due to diffusion of ions during ion implantation. Therefore, the interval between one of the n+-type source regions 7 and one of the p++-type contact regions 8 may be set to be at least (0.3+0.2)×2=1.0 μm.

Further, as depicted in FIGS. 2 and 4, the p-type silicon carbide epitaxial layer 3 and the n-type high-concentration region 6 (2) are disposed between the trenches 18, in regions facing, in the depth direction z, regions in which the n+-type source regions 7 are disposed. As depicted in FIGS. 3 and 4, between the trenches 18, in regions facing, in the depth direction z, regions in which the p++-type contact regions 8 are provided, the p-type silicon carbide epitaxial layer 3, the first p+-type base regions 4, and the second p+-type base regions 5 are provided in contact with one another. As depicted in FIG. 4, between the trenches 18, the p-type silicon carbide epitaxial layer 3, the first p+-type base regions 4, and the second p+-type base regions 5 are disposed in contact with one another in regions facing, in the depth direction z, regions that are free of the p++-type contact regions 8 and the n+-type source regions 7.

Figure 5:
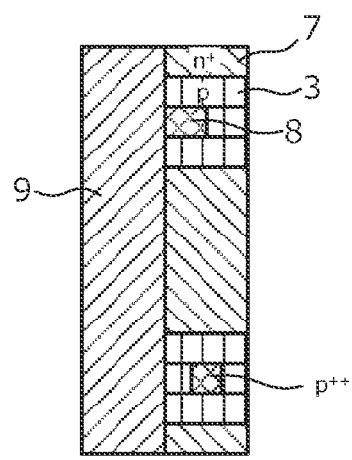
FIG. 5 is a plan view of another structure of a silicon carbide semiconductor device according to the first embodiment.

FIG. 5 is a plan view of another structure of a silicon carbide semiconductor device according to the first embodiment. In the structure depicted in FIG. 1, each of the p++-type contact regions 8 is in contact with both of the trenches 18 adjacent thereto. However, as depicted in FIG. 5, configuration may be such that the p++-type contact regions 8 are in contact with only one of the trenches 18 adjacent thereto or are not in contact either of the trenches 18 adjacent thereto.

Here, conditions for enhancing the channel width density of the silicon carbide semiconductor device according to the first embodiment are described in detail. First, a channel width density Dch' of the conventional silicon carbide semiconductor device is obtained. In the conventional silicon carbide semiconductor device, a width of the gate electrodes 110 is assumed to be Lg' (μm), a length of the n+-type base regions 107 in the x-direction is assumed to be Ln' (μm), and a length of the p++-type contact regions 108 in the x-direction is assumed to be Lp' (μm) (refer to FIG. 18). For example, respective values are Lg'=0.7 μm, Ln'=0.85 μm, and Lp'=1 μm.

Here, when a cell pitch Py' in the y-direction is assumed to be a fixed value of, for example, 1 μm, a cell pitch Px' (μm) in the x-direction, the cell pitch Py' in the y-direction (μm), a channel width Wch' (μm) in the y-direction, and the channel width density Dch' (μm/μm²) are as follows.

$Px'=Lg'+2Ln'+Lp'$ $Py'=1$ $Wch'=2Py'$ $Dch'=Wch'/(Px'\times Py')=2/(Lg'+2Ln'+Lp')$ Similarly, in the first embodiment as well, a width of the gate electrodes 10 is assumed to be Lg and a length of the n+-type source regions 7 in the x-direction is assumed to be Ln. Further, in the first embodiment, a length of the n+-type source regions 7 in the y-direction is assumed to be Wn, a length of the p++-type contact regions 8 in the y-direction is assumed to be Wpc, and a length of the interval between one of the n+-type source regions 7 and one of the p++-type contact regions 8, in the y-direction, is assumed to be Wp (refer to FIG. 1).

In this instance, a cell pitch Px (μm) in the x-direction, a cell pitch Py (μm) in the y-direction, a channel width Wch (μm) in the y-direction, and a channel width density Dch (μm/μm²) are as follows.

$Px=Lg+Ln$ $Py=2Wp+Wpc+Wn$ $Wch=2Wn$ (since a channel is formed on both sides of each of the n+-type source regions 7)

$Dch=Wch/(Px\times Py)=2Wn/\{(Lg+Ln)\times(2Wp+Wpc+Wn)\}$

Thus, in the silicon carbide semiconductor device according to the first embodiment, a condition for enhancing the channel width density is Dch≥Dch'. Therefore, Wn≥(2Wp+Wpc)×Px/(Px'−Px)=(2Wp+Wpc)×(Lg+Ln)/(Lg'+2Ln'+Lp'−Lg−Ln) is satisfied and therefore, in the silicon carbide semiconductor device according to the first embodiment, the channel width density may be enhanced to be greater than that of the conventional silicon carbide semiconductor device.

Figure 6:
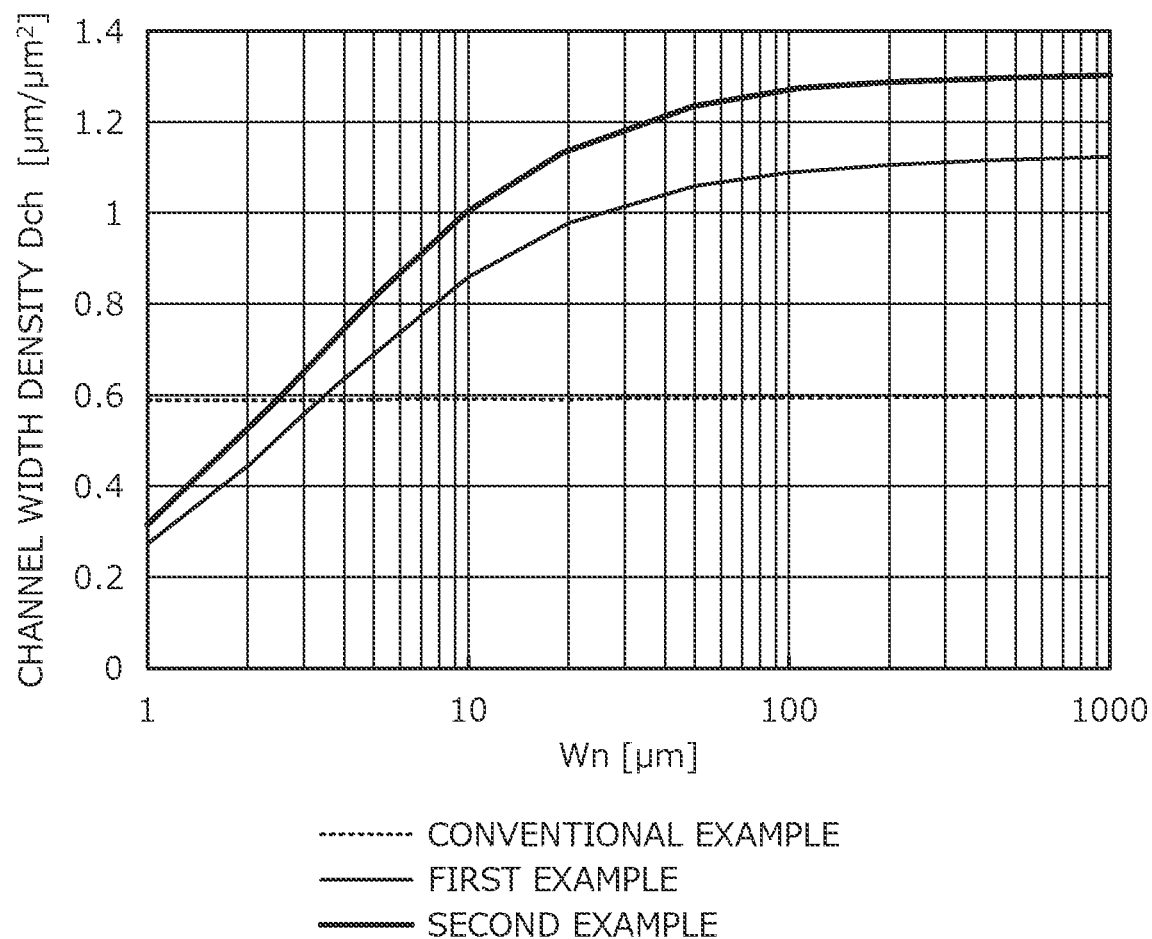
FIG. 6 is a graph of channel width density of the silicon carbide semiconductor device according to the first embodiment.

FIG. 6 is a graph of channel width density of the silicon carbide semiconductor device according to the first embodiment. In FIG. 6, a horizontal axis indicates Wn (length of the n+-type source regions 7 in the x-direction) in units of μm. A vertical axis therein indicates the channel width density Dch in units of μm/μm². For the conventional silicon carbide semiconductor device, channel width density is shown for an instance of Lg'=0.7 μm, Ln'=0.85 μm, and Lp'=1 μm.

For the silicon carbide semiconductor device according to the first embodiment, an instance of a first example: Lg=0.7 μm, Ln=1.1 μm, Wp=1 μm, Wpc=1 μm and an instance of a second example: Lg=0.7 μm, Ln=0.85 μm, Wp=1 μm, Wpc=1 μm are shown.

From FIG. 6, it is found that in the first example, when Wn≥at least 3.375 μm, the channel width density Dch is higher than that of the conventional silicon carbide semiconductor device; and in the second example, when Wn≥at least 2.514 μm, the channel width density Dch is higher than that of the conventional silicon carbide semiconductor device.

Next, a method of manufacturing the silicon carbide semiconductor device according to the first embodiment is described. FIGS. 7, 8, 9, 10, 11, and 12 are cross-sectional views of states of the silicon carbide semiconductor device according to the first embodiment during manufacture.

Figure 7:
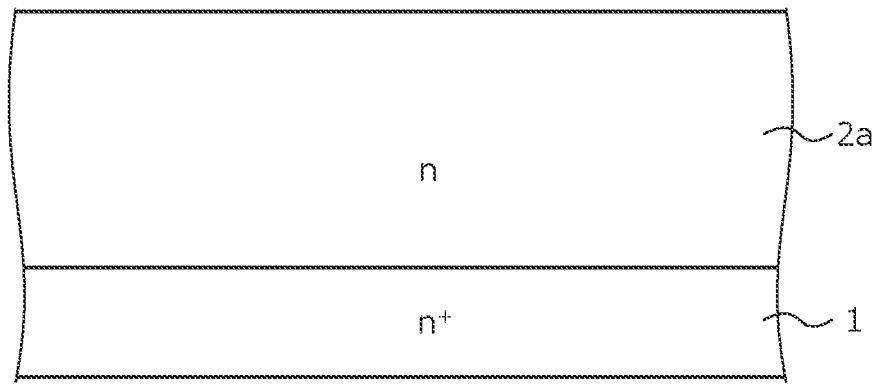
FIG. 7 is a cross-sectional view of a state of the silicon carbide semiconductor device according to the first embodiment during manufacture.

First, the $n^+$-type silicon carbide substrate 1 containing an n-type silicon carbide is prepared. Then, on a first main surface of the $n^+$-type silicon carbide substrate 1, a first n-type silicon carbide epitaxial layer 2a is epitaxially grown to have a thickness of, for example, about 30 μm while an n-type impurity, for example, nitrogen atoms (N) is doped. The state up to here is depicted in FIG. 7.

Next, on the surface of the first n-type silicon carbide epitaxial layer 2a, an ion implantation mask having predetermined openings is formed by a photolithographic technique using, for example, an oxide film. Then, a p-type impurity such as aluminum is implanted into the openings of the oxide film, thereby forming the first $p^+$-type base regions 4 of a depth of about 0.5 μm.

Further, formation is such that a distance between adjacent first $p^+$-type base regions 4 of the first $p^+$-type base regions 4 is about 1.5 μm. An impurity concentration of the first $p^+$-type base regions 4 is set to be, for example, about $5\times10^{18}/cm^3$.

Figure 8:
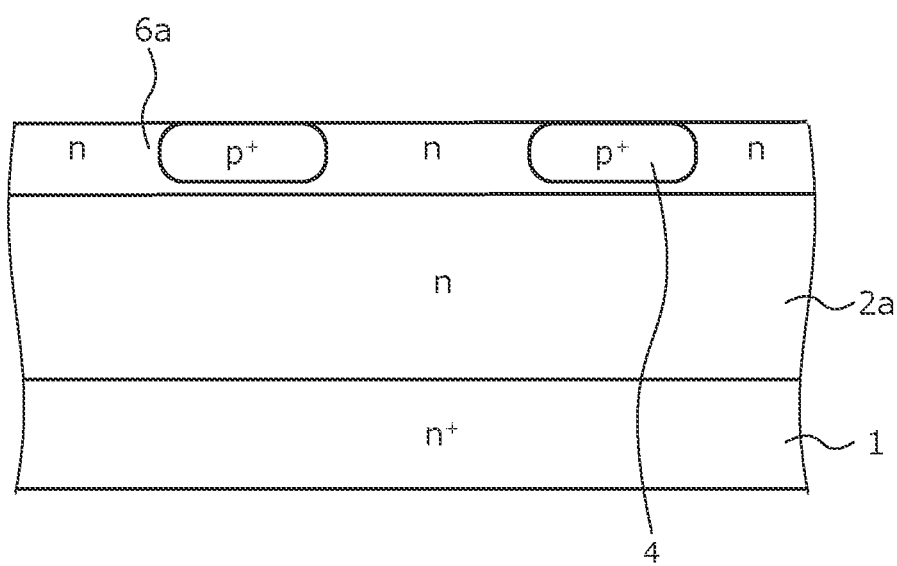
FIG. 8 is a cross-sectional view of a state of the silicon carbide semiconductor device according to the first embodiment during manufacture.

Next, portions of the ion implantation mask may be removed and an n-type impurity such as nitrogen may be ion-implanted in the openings, whereby a lower n-type high-concentration region 6a of a depth of, for example, about 0.5 μm may be formed in a portion of a surface region of the first n-type silicon carbide epitaxial layer 2a. An impurity concentration of the lower n-type high-concentration region 6a is set to be, for example, about $1\times10^{17}/cm^3$. The state up to here is depicted in FIG. 8.

Next, on the surface of the first n-type silicon carbide epitaxial layer 2a, a second n-type silicon carbide epitaxial layer 2b doped with an n-type impurity such as nitrogen is formed to have a thickness of about 0.5 μm. An impurity concentration of the second n-type silicon carbide epitaxial layer 2b is set to be about $3\times10^{15}/cm^3$. Hereinafter, the first n-type silicon carbide epitaxial layer 2a and the second n-type silicon carbide epitaxial layer 2b are collectively the n-type silicon carbide epitaxial layer 2.

Next, on the surface of the second n-type silicon carbide epitaxial layer 2b, in regions facing, in the depth direction z, regions free of the $n^+$-type source regions 7, an ion implantation mask having predetermined openings is formed by photolithography using, for example, an oxide film. Then, a p-type impurity such as aluminum is ion-implanted in the openings of the oxide film, whereby the second $p^+$-type base regions 5 (not depicted) of a depth of about 0.5 μm are formed so as to overlap the first $p^+$-type base regions 4. An impurity concentration of the second $p^+$-type base regions 5 is set so as to become, for example, about $5\times10^{18}/cm^3$.

Figure 9:
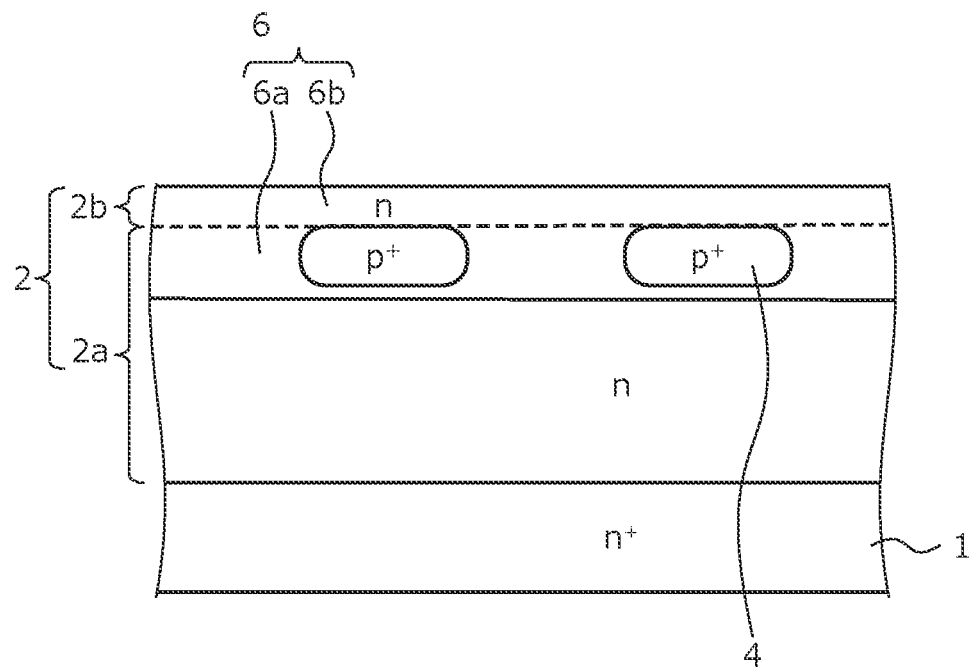
FIG. 9 is a cross-sectional view of a state of the silicon carbide semiconductor device according to the first embodiment during manufacture.

Next, portions of the ion implantation mask may be removed and an n-type impurity such as nitrogen may be ion-implanted in the openings, whereby in a portion of a surface region of the second n-type silicon carbide epitaxial layer 2b, an upper n-type high-concentration region 6b of a depth of, for example, about 0.5 μm may be formed. An impurity concentration of the upper n-type high-concentration region 6b is set to be, for example, about $1\times10^{17}/cm^3$. The upper n-type high-concentration region 6b and the lower n-type high-concentration region 6a are formed so as to at least partially contact each other and form the n-type high-concentration region 6. Nonetheless, the n-type high-concentration region 6 may be formed in an entire area of the substrate or may be omitted. The state up to here is depicted in FIG. 9.

Next, on the surface of the n-type silicon carbide epitaxial layer 2, the p-type silicon carbide epitaxial layer 3 is formed to have thickness of about 1.1 μm, by epitaxial growth. An impurity concentration of the p-type silicon carbide epitaxial layer 3 is set to be about $4\times10^{17}/cm^3$. After the p-type silicon carbide epitaxial layer 3 is formed by epitaxial growth, in the p-type silicon carbide epitaxial layer 3, a p-type impurity such as aluminum may be further ion-implanted in channel regions of the p-type silicon carbide epitaxial layer 3.

Figure 10:
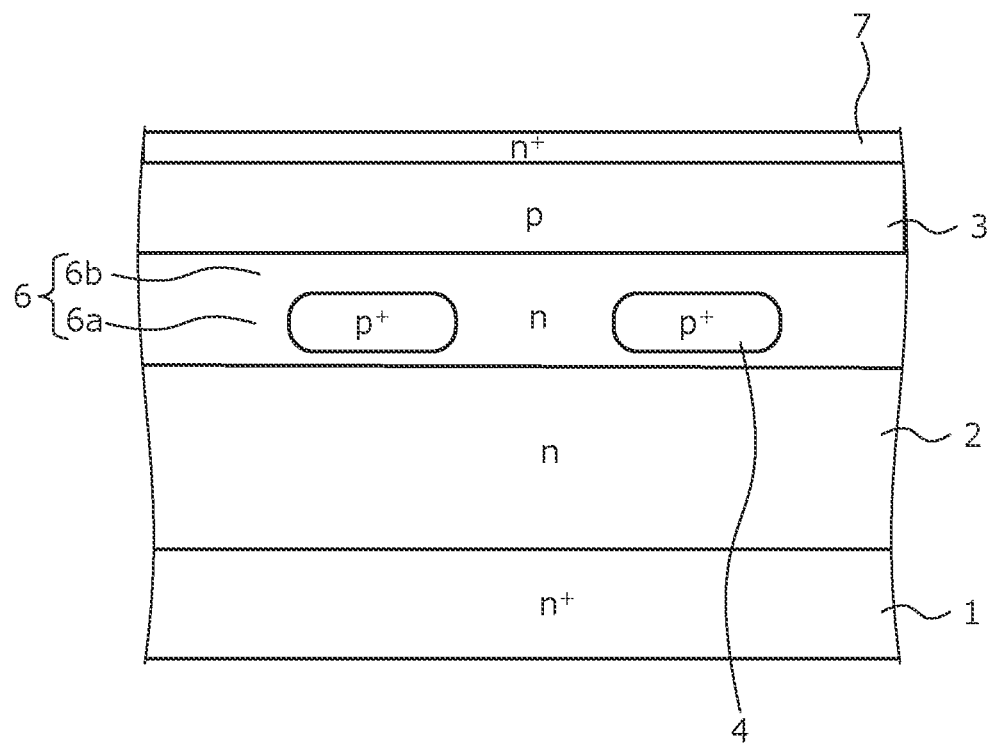
FIG. 10 is a cross-sectional view of a state of the silicon carbide semiconductor device according to the first embodiment during manufacture.

Next, on the surface of the p-type silicon carbide epitaxial layer 3, an ion implantation mask having predetermined openings is formed by photolithography using, for example, an oxide film. In these openings, an n-type impurity such as nitrogen (N), phosphorus (P), etc. is ion-implanted, thereby forming the $n^+$-type source regions 7 in portions of the p-type silicon carbide epitaxial layer 3 at the surface thereof. Next, the ion implantation mask used in forming the $n^+$-type source regions 7 is removed and by a similar method, an ion implantation mask having predetermined openings is formed and a p-type impurity such as phosphorus is ion-implanted in a portion of the surface of the p-type silicon carbide epitaxial layer 3, thereby forming the $p^{++}$-type contact regions 8 (not depicted). An impurity concentration of the $p^{++}$-type contact regions 8 is set so as to become higher than the impurity concentration of the p-type silicon carbide epitaxial layer 3. The $n^+$-type source regions 7 and the $p^{++}$-type contact regions 8 are formed in the respective shapes in a plan view, depicted in FIG. 1. The state up to here is depicted in FIG. 10. FIG. 10 depicts a cross-section along cutting line A-A' in FIG. 1.

Next, a heat treatment (annealing) is performed in an inert gas atmosphere of a temperature of about 1700 degrees C., thereby implementing an activation process of the first $p^+$-type base regions 4, the second $p^+$-type base regions 5, the $n^+$-type source regions 7, and the $p^{++}$-type contact regions 8. As described, ion implanted regions may be collectively activated by a single session of the heat treatment or may be activated by performing the heat treatment each time ion implantation is performed.

Figure 11:
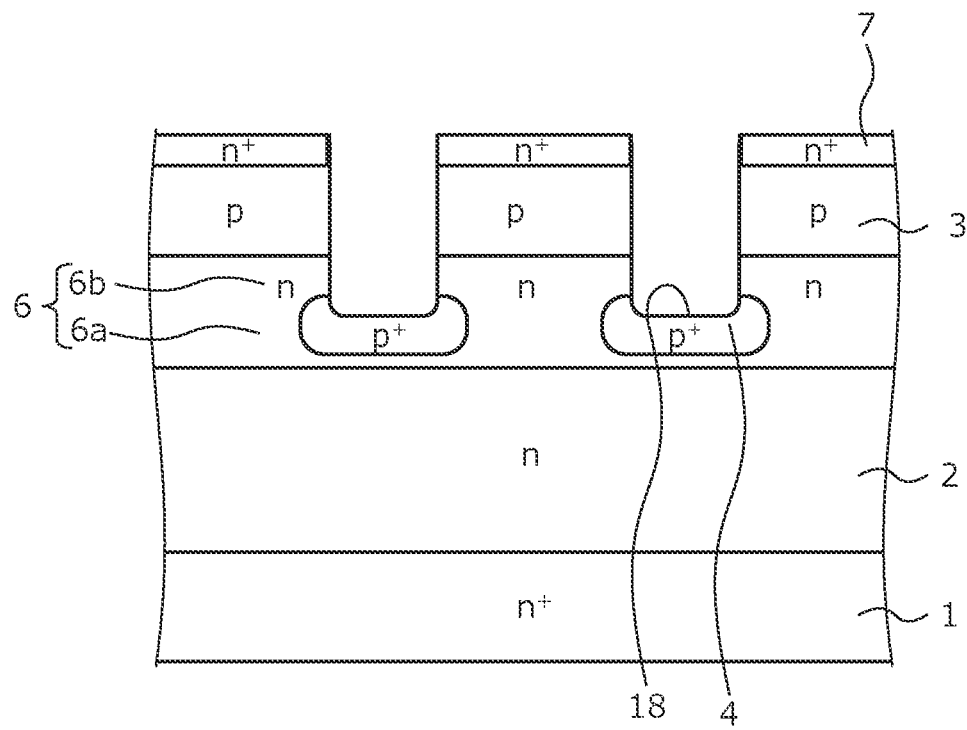
FIG. 11 is a cross-sectional view of a state of the silicon carbide semiconductor device according to the first embodiment during manufacture.

Next, on the surface of the p-type silicon carbide epitaxial layer 3, a trench formation mask having predetermined openings is formed by photolithography using, for example, an oxide film. Next, the trenches 18 that penetrate the p-type silicon carbide epitaxial layer 3 and reach the n-type high-concentration region 6 (2) are formed by dry etching. The bottoms of the trenches 18 may respectively reach the first $p^+$-type base regions 4 formed in the n-type high-concentration region 6 (2). Next, the trench formation mask is removed. The state up to here is depicted in FIG. 11.

Next, the gate insulating films 9 are formed along the surfaces of the $n^+$-type source regions 7 and the bottoms and the sidewalls of the trenches 18. The gate insulating films 9 may be formed by thermal oxidation of a temperature of about 1000 degrees C. in an oxygen atmosphere. Further, the gate insulating films 9 may be formed by a deposition method by a chemical reaction such as that for a high temperature oxide (HTO).

Next, a polycrystalline silicon film doped with, for example, phosphorus atoms is provided on the gate insulating films 9. The polycrystalline silicon film may be formed so as to be embedded in the trenches 18. The polycrystalline silicon film is patterned by photolithography and is left in the trenches 18 to thereby form the gate electrodes 10.

Figure 12:
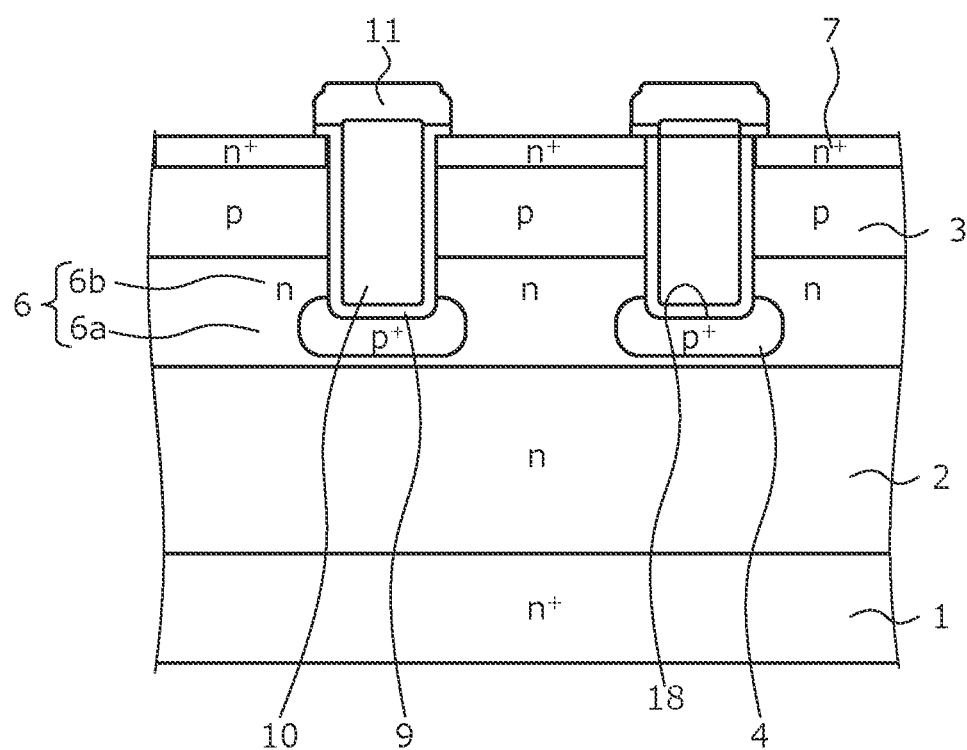
FIG. 12 is a cross-sectional view of a state of the silicon carbide semiconductor device according to the first embodiment during manufacture.

Next, for example, a phosphate glass is deposited to have a thickness of about 1 μm and to cover the gate insulating films 9 and the gate electrodes 10 to thereby form the insulating film 11. The insulating film 11 and the gate insulating films 9 are patterned by photolithography to thereby form contact holes exposing the $n^+$-type source regions 7 and the $p^{++}$-type contact regions 8. Thereafter, a heat treatment (reflow) is performed and the insulating film 11 is planarized. The state up to here is depicted in FIG. 12. Further, contact holes are formed in the insulating film 11 and thereafter, a barrier metal containing titanium (Ti) or titanium nitride (TiN) or stacked layers of titanium and titanium nitride may be formed. In this instance, the contact holes that expose the $n^+$-type source regions 7 and the type contact regions 8 are provided in the barrier metal as well.

Next, a conductive film constituting the source electrodes 13 is formed on the insulating film 11 and in the contact holes provided in the insulating film 11. The conductive film is, for example, a nickel (Ni) film. Further, a nickel (Ni) film is similarly formed on a second main surface of the $n^+$-type silicon carbide substrate 1. Thereafter, a heat treatment of a temperature of, for example, about 970 degrees C. is performed, whereby the nickel film in the contact holes is converted into a silicide, thereby forming the source electrodes 13. Concurrently, the nickel film formed on the second main surface is formed into the back electrode 14 that forms an ohmic contact with the $n^+$-type silicon carbide substrate 1. Thereafter, unreacted portions of the nickel film are removed, for example, leaving only the source electrodes 13 in the contact holes.

Next, the source electrode pad (not depicted) is formed so as to be embedded in the contact holes. A portion of a metal layer deposited to form the source electrode pad may be used as a gate pad. On the back surface of the $n^+$-type silicon carbide substrate 1, a metal film such as a nickel (Ni) film, a titanium (Ti) film, etc. is formed at a contact portion for the back electrode 14 using sputtered deposition. The metal film may be a combination of stacked Ni films and Ti films. Thereafter, annealing such as rapid thermal annealing (RTA) is implemented so that the metal film is converted into a silicide, forming an ohmic contact. Thereafter, for example, a thick film such as a stacked film in which a Ti film, a Ni film, and a gold (Au) film are sequentially stacked is formed by electron beam (EB) deposition, whereby the back electrode 14 is formed.

In the epitaxial growth and the ion implantation described above, as an n-type impurity (n-type dopant), for example, nitrogen (N) or phosphorus (P) that are n-types with respect to silicon carbide, arsenic (As), antimony (Sb), etc. is used. As a p-type impurity (p-type dopant), for example, boron (B) or aluminum (Al) that are p-types with respect to silicon carbide, gallium (Ga), indium (In), thallium (Tl), etc. is used. In this manner, the trench-type MOSFET 50 depicted in FIGS. 1 to 4 is completed.

As described above, according to the silicon carbide semiconductor device according to the first embodiment, the $n^+$-type source regions and the $p^{++}$-type contact regions are provided between trenches so as to be in contact with the trenches in the x-direction, and are periodically disposed to be apart from one another in the y-direction. As a result, widths of the $n^+$-type source regions and of the $p^{++}$-type contact regions may be reduced. Therefore, reduction of the cell pitch becomes possible and the channel width density per unit area is enhanced, enabling reduction of the ON resistance.

Further, intervals are provided between the $n^+$-type source regions and the $p^{++}$-type contact regions, and the p-type silicon carbide epitaxial layer is exposed. As a result, overlapping of the $n^+$-type source regions and the $p^{++}$-type contact regions may be prevented. Therefore, point defects due to the overlapping of the $n^+$-type source regions and the $p^{++}$-type contact regions may be prevented and the gate reliability may be enhanced.

Figure 13:
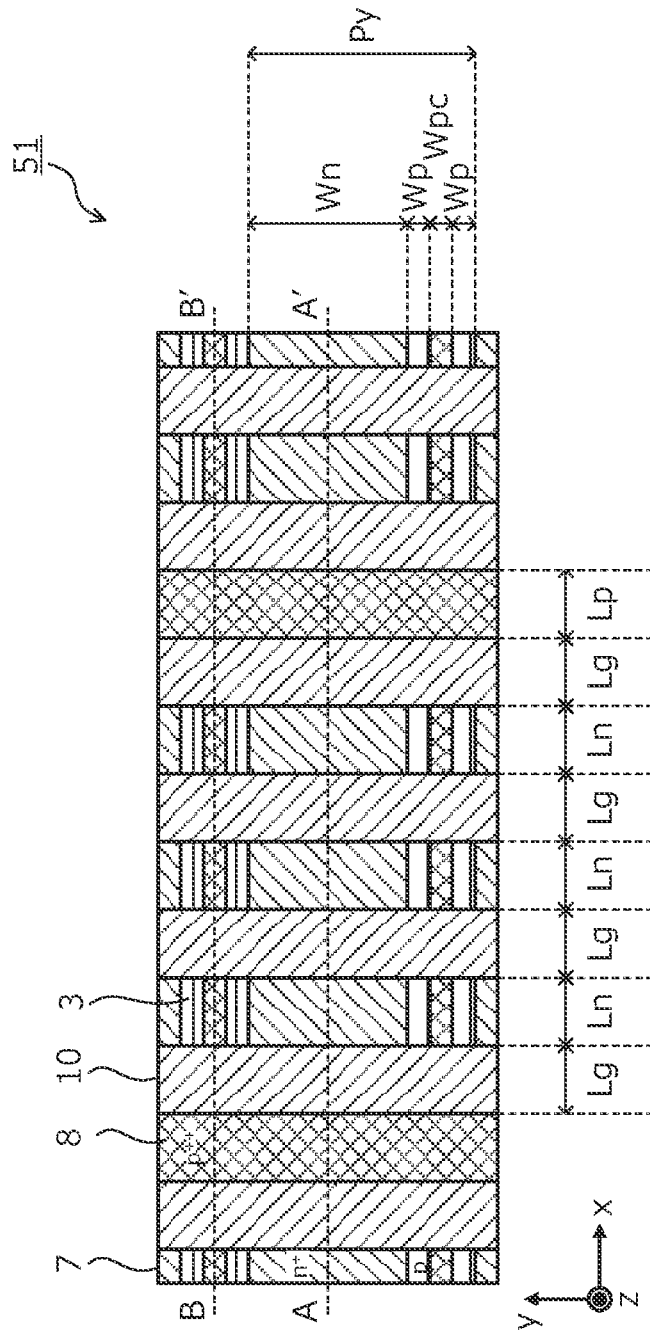
FIG. 13 is a plan view of a structure of a silicon carbide semiconductor device according to a second embodiment.
Figure 14:
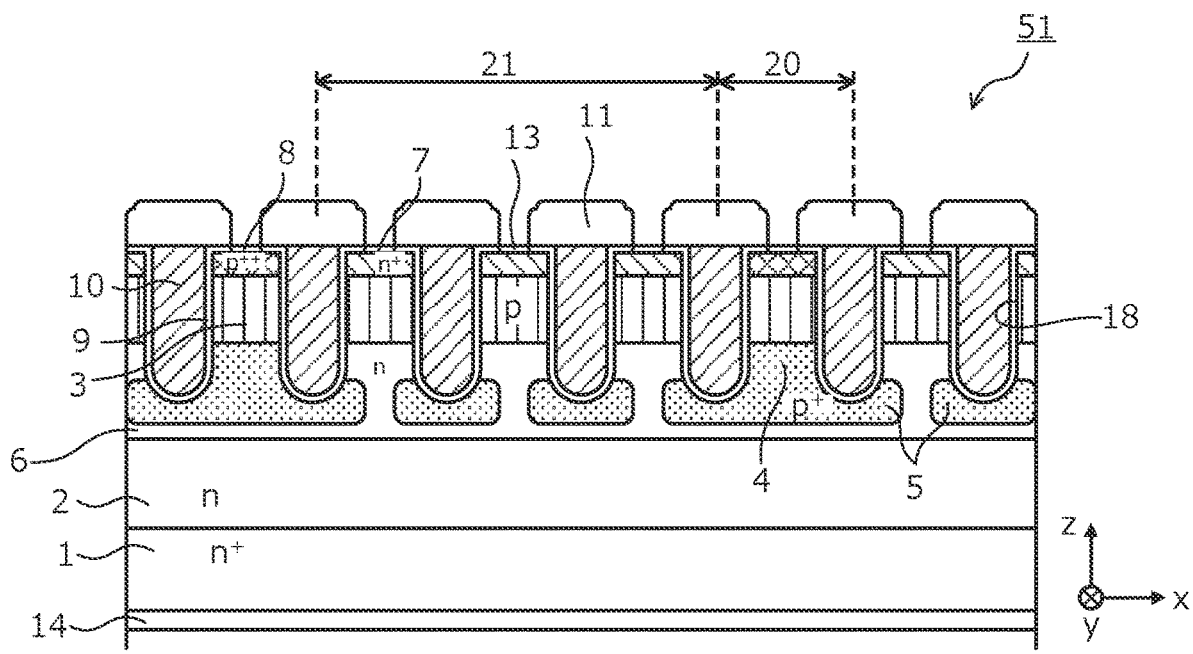
FIG. 14 is a cross-sectional view of the structure of the silicon carbide semiconductor device according to the second embodiment along cutting line A-A' in FIG. 12.
Figure 15:
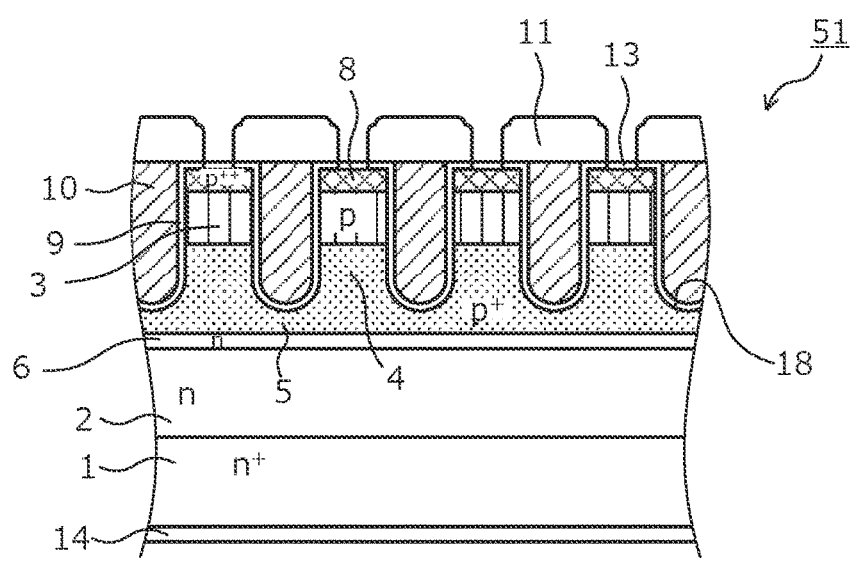
FIG. 15 is a cross-sectional view of the structure of the silicon carbide semiconductor device according to the second embodiment along cutting line B-B' in FIG. 12.

FIG. 13 is a plan view of a structure of a silicon carbide semiconductor device according to a second embodiment. FIG. 14 is a cross-sectional view of the structure of the silicon carbide semiconductor device according to the second embodiment along cutting line A-A' in FIG. 12. FIG. 15 is a cross-sectional view of the structure of the silicon carbide semiconductor device according to the second embodiment along cutting line B-B' in FIG. 12.

A silicon carbide semiconductor device 51 according to the second embodiment differs from the silicon carbide semiconductor device (the trench-type MOSFET 50) according to the first embodiment in that in all of the regions between the trenches 18, the diode cell regions 20 in which the $p^{++}$-type contact regions 8 are included are provided. By providing the diode cell regions 20, a need to connect a diode externally when the silicon carbide semiconductor device 51 is used in an inverter, etc. is eliminated.

As depicted in FIGS. 14 and 15, in the diode cell regions 20, between the trenches 18, in regions facing, in the depth direction z, regions in which the $p^{++}$-type contact regions 8 are provided, the p-type silicon carbide epitaxial layer 3, the first $p^+$-type base regions 4, and second $p^+$-type base regions (third semiconductor regions of the second conductivity type) 5 are disposed in contact with one another.

Between the diode cell regions 20, MOS cell regions 21 in which at least one MOS stripe having $n^+$-type source regions and $p^{++}$-type contact regions between the trenches is provided. FIG. 13 depicts an example in which three of the MOS stripes are disposed in each of the MOS cell regions 21. In the MOS cell regions 21, similarly to the first embodiment, the $n^+$-type source regions 7 and the $p^{++}$-type contact regions 8 are provided between the trenches 18 and in contact with the trenches 18 in the x-direction, and are periodically disposed apart from one another in the y-direction.

As depicted in FIG. 14, between the trenches 18 of the MOS cell regions 21, in regions facing, in the depth direction z, regions in which the $n^+$-type source regions 7 are provided, similarly to the first embodiment, the p-type silicon carbide epitaxial layer 3 and the n-type high-concentration region 6 (2) are disposed. While not depicted, between the trenches 18 of the MOS cell regions 21, in regions facing, in the depth direction z, regions in which the $p^{++}$-type contact regions 8 are provided, the p-type silicon carbide epitaxial layer 3, the first $p^+$-type base regions 4, and the second $p^+$-type base regions 5 are disposed in contact with one another. In other words, the structure is similar to that of the diode cell regions 20. While not depicted, between the trenches 18 of the MOS cell regions 21, in regions facing, in the depth direction z, regions free of the $p^{++}$-type contact regions 8 and the $n^+$-type source regions 7, the p-type silicon carbide epitaxial layer 3, the first $p^+$-type base regions 4, and the second $p^+$-type base regions 5 are disposed in contact with one another. In other words, the structure is similar to that of the diode cell regions 20.

Further, in the diode cell regions 20, surfaces of the first $p^+$-type base regions 4, the surfaces thereof facing the $n^+$-type silicon carbide substrate 1, may be shallower that surfaces of the first $p^+$-type base regions 4 in the MOS cell regions 21, the surfaces thereof facing the $n^+$-type silicon carbide substrate 1, i.e., may be closer to the source electrodes 13. In this instance, the diode cell regions 20 operate and when avalanche breakdown occurs, provision of the continuous p-type region facilitates current flow, enabling reduction of potential difference.

In the second embodiment as well, similarly to the first embodiment, configuration may be such that the $p^{++}$-type contact regions 8 are in contact with only one of the trenches 18 adjacent thereto or may be apart from both of the trenches 18 adjacent thereto.

Here, conditions for enhancing the channel width density of the silicon carbide semiconductor device according to the second embodiment are described in detail. The number of the MOS cell regions 21 disposed between the diode cell regions 20 is assumed to be "n" and a the length of the $p^{++}$-type contact regions 8 in the x-direction is assumed to be Lp.

In this instance, the cell pitch Px (μm) in the x-direction, the cell pitch Py (μm) in the y-direction, the channel width Wch (μm) in the y-direction, and the channel width density Dch (μm/μm$^2$) are as follows.

$$Px=n\times(Lg+Ln)+Lg+Lp$$

$$Py=2Wp+Wpc+Wn$$

$$Wch=2nWn$$

$$Dch=Wch/(Px\times Py)=2nWn/[\{n(Lg+Ln)+Lg+Lp\}\times(2Wp+Wpc+Wn)]$$

Thus, in the silicon carbide semiconductor device according to the second embodiment, a condition for enhancing the channel width density is Dch≥Dch'. Therefore, Wn≥(2Wp+Wpc)×Px/(nPx'−Px)=(2Wp+Wpc)×{n(Lg+Ln)+Lg+Lp}/{n(Lg'+2Ln'+Lp')−n(Lg+Ln)−Lg−Lp} is satisfied and therefore, in the silicon carbide semiconductor device according to the second embodiment, the channel width density may be enhanced to be greater than that in the conventional silicon carbide semiconductor device.

Figure 16:
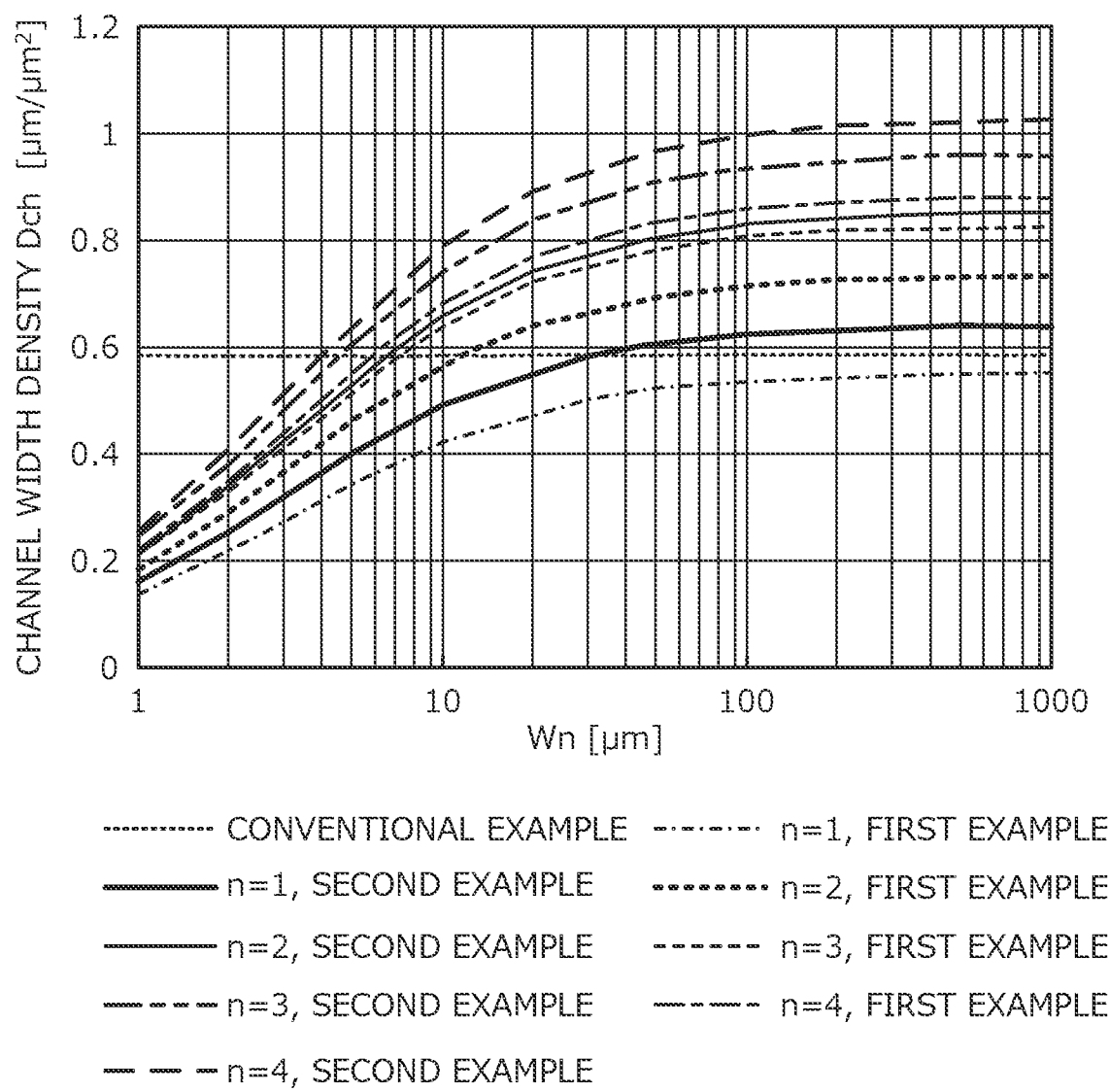
FIG. 16 is a graph of channel width density of the silicon carbide semiconductor device according to the second embodiment.

FIG. 16 is a graph of channel width density of the silicon carbide semiconductor device according to the second embodiment. In FIG. 16, a horizontal axis indicates Wn (length of the $n^+$-type source regions 7 in the x-direction) in units of μm. A vertical axis therein indicates the channel width density Dch in units of μm/μm$^2$. For the conventional silicon carbide semiconductor device, channel width density is shown for an instance of Lg'=0.7 μm, Ln'=0.85 μm, Lp'=1 μm.

For the silicon carbide semiconductor device according to the second embodiment, an instance of the first example: Lg=0.7 μm, Ln=1.1 μm, Wp=1 μm, Wpc=1 μm, and an instance of the second example: Lg=0.7 μm, Ln=0.85 μm, Wp=1 μm, Wpc=1 μm are depicted. For each of the first example and the second example, instances in which "n" (the number of the MOS stripes included in one of the MOS cell regions 21, each MOS stripe having between trenches, the $n^+$-type source regions 7 and the $p^{++}$-type contact regions 8)=1 to 4 are depicted.

From FIG. 16, it is found that in the first example, when n≥at least 2, the channel width density Dch may be increased to be greater than that in the conventional silicon carbide semiconductor device. In particular, when n=2, Wn≥at least 11.572 μm, when n=3, Wn≥at least 7.2 μm, and when n=4, Wn≥at least 5.87 μm and therefore, it is found that the channel width density Dch is greater than that in the conventional silicon carbide semiconductor device. Further, in the second example, when n≥at least 1, the channel width density Dch may be increased to be greater than that in the conventional silicon carbide semiconductor device. In particular, when n=1, Wn≥at least 31 μm, when n=2, Wn≥at least 6.489 μm, when n=3, Wn≥at least 4.65 μm, and when n=4, Wn≥at least 3.975 μm and therefore, it is found that the channel width density Dch may be increased to be greater than that in the conventional silicon carbide semiconductor device.

A method of manufacturing the silicon carbide semiconductor device according to the second embodiment is similar to the method of manufacturing according to the first embodiment and therefore, description thereof is omitted herein.

As described above, according to the silicon carbide semiconductor device according to the second embodiment, even when the diode cell regions are provided, effects similar to those of the first embodiment are obtained. Further, by providing diode cell regions, a need to connect a diode externally when the silicon carbide semiconductor device is used in an inverter, etc. is eliminated.

In the foregoing, the present invention may be variously modified within a range not departing from the spirit of the invention and, for example, in the embodiments described above, dimension, impurity concentrations, etc. of regions may be set according to necessary specifications. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, the $n^+$-type source regions (first semiconductor regions of the first conductivity type) and the $p^{++}$-type contact regions (second semiconductor regions of the second conductivity type) are provided between the trenches so as to be in contact with the trenches in the x-direction, and are periodically disposed to be apart from one another in the y-direction. As a result, the widths of the $n^+$-type source regions and of the $p^{++}$-type contact regions may be reduced. Therefore, reduction of the cell pitch becomes possible and the channel width density per unit area is enhanced, enabling reduction of the ON resistance.

Further, intervals are provided between the $n^+$-type source regions and the $p^{++}$-type contact regions, and the p-type silicon carbide epitaxial layer is exposed. As a result, overlapping of the $n^+$-type source regions and the $p^{++}$-type contact regions may be prevented. Therefore, defects that occur due to the overlapping of the $n^+$-type source regions and the $p^{++}$-type contact regions may be prevented and the gate reliability may be enhanced.

The semiconductor device according to the present invention achieves an effect in that the channel width density per unit area is enhanced and the ON resistance may be reduced.

As described above, the silicon carbide semiconductor device according to the present invention is useful for power semiconductor devices used in power converting equipment such as inverters and in power source devices such as in various industrial machines and in automobile igniters.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device, comprising:
    a plurality of trenches provided at a first main surface of a semiconductor base that includes a semiconductor substrate of a first conductivity type, the plurality of trenches including a plurality of longitudinal portions that each extend in a first direction;
a plurality of first semiconductor regions of the first conductivity type, each first semiconductor region being selectively provided at the first main surface of the semiconductor base and being in contact with a sidewall of one of the plurality of longitudinal portions;
a plurality of bottom regions of a second conductivity type, respectively in contact with bottoms of respective ones of the plurality of longitudinal portions; and
a second semiconductor region of the second conductivity type, provided along a sidewall of a corresponding one of the plurality of longitudinal portions and extending from the first main surface of the semiconductor base to a corresponding one of the plurality of bottom regions that is in contact with the corresponding one of the plurality of longitudinal portions, wherein
the second semiconductor region includes a plurality of upper portions thereof that are periodically exposed from the first main surface of the semiconductor base in the first direction, and
on the first main surface, in the first direction, an interval of, among the plurality of upper portions of the second semiconductor region, an adjacent two upper portions that are adjacent in the first direction is greater than a length of each of the plurality of upper portions of the second semiconductor region.

2. The semiconductor device according to claim 1, wherein
the second semiconductor region includes a plurality of portions of the second semiconductor region that are periodically provided in the first direction.

3. The semiconductor device according to claim 1, wherein
the second semiconductor region includes a plurality of upper portions of the second semiconductor region that are periodically exposed from the first main surface of the semiconductor base in the first direction, and
on the first main surface, in the first direction, an interval of, among the plurality of upper portions of the second semiconductor region, an adjacent two upper portions that are adjacent in the first direction is at least 2.514 μm.

4. The semiconductor device according to claim 1, wherein
the second semiconductor region includes:
a semiconductor layer of the second conductivity type;
a plurality of high-concentration semiconductor regions of the second conductivity type, selectively provided at the first main surface of the semiconductor base, each high-concentration semiconductor region having an impurity concentration higher than an impurity concentration of the semiconductor layer;
a connecting region of the second conductivity type that connects the semiconductor layer to the corresponding one of the plurality of bottom regions.

5. The semiconductor device according to claim 4, wherein
each high-concentration semiconductor region is provided across a mesa region between, among the plurality of longitudinal portions, an adjacent two longitudinal portions that are adjacent in a second direction orthogonal to the first direction.

6. The semiconductor device according to claim 4, wherein
each high-concentration semiconductor region is in contact with only one of an adjacent two longitudinal portions among the plurality of longitudinal portions that are adjacent in a second direction orthogonal to the first direction.

7. The semiconductor device according to claim 1, wherein
at least one of the plurality of first semiconductor regions is provided across a mesa region between an adjacent two longitudinal portions among the plurality of longitudinal portions that are adjacent in a second direction orthogonal to the first direction.

8. The semiconductor device according to claim 1, further comprising:
an interlayer insulating film provided on the first main surface of the semiconductor base;
a plurality of contact holes that penetrate through the interlayer insulating film in a depth direction;
a source electrode that is in contact with the plurality of first semiconductor regions and the second semiconductor region, via the plurality of contact holes.

9. The semiconductor device according to claim 1, wherein
the semiconductor device is a trench-type SiC-MOSFET.

10. A semiconductor device, comprising:
a plurality of trenches provided at a first main surface of a semiconductor base that includes a semiconductor substrate of a first conductivity type, the plurality of trenches including a plurality of longitudinal portions that each extend in a first direction;
a plurality of mesa regions, each being provided between an adjacent two longitudinal portions among the plurality of longitudinal portions that are adjacent in a second direction orthogonal to the first direction; and
a plurality of bottom regions of a second conductivity type, respectively in contact with bottoms of respective ones of the plurality of longitudinal portions, wherein
each mesa region includes:
a semiconductor layer of the second conductivity type;
a plurality of first semiconductor regions of the first conductivity type, each first semiconductor region being selectively provided at the first main surface of the semiconductor base and in contact with a sidewall of one of the adjacent two longitudinal portions; and
a plurality of connecting regions of the second conductivity type that are periodically provided in the first direction, the plurality of connecting regions connecting the semiconductor layer to bottom regions that are respectively in contact with the adjacent two longitudinal portions forming said each mesa region,
the semiconductor layer includes a plurality of upper portions thereof that are periodically exposed from the first main surface of the semiconductor base in the first direction, and
on the first main surface, in the first direction, an interval of, among the plurality of upper portions of the semiconductor layer, an adjacent two upper portions that are adjacent in the first direction is greater than a length of each of the plurality of upper portions of the semiconductor layer.

11. The semiconductor device according to claim 10, wherein
each connecting region extends from one to the other of the adjacent two longitudinal portions.

12. The semiconductor device according to claim 10, wherein
an impurity concentration of each of the plurality of bottom regions is higher than an impurity concentration of the semiconductor layer.

13. The semiconductor device according to claim 10, wherein
an impurity concentration of each of the plurality of connecting regions is higher than an impurity concentration of the semiconductor layer.

14. The semiconductor device according to claim 10, further comprising
a gate electrode embedded in each of the plurality of longitudinal portions via a gate insulating film.

15. The semiconductor device according to claim 14, wherein
the plurality of mesa regions include:
  a plurality of first mesa regions, each first mesa region including the semiconductor layer and the plurality of first semiconductor regions, both of which are in contact with the gate insulating film; and
  a plurality of second mesa regions, each second mesa region including the plurality of connecting regions that respectively extend between the adjacent two longitudinal portions that form said each second mesa region.

16. A semiconductor device, comprising:
a plurality of trenches provided at a first main surface of a semiconductor base that includes a semiconductor substrate of a first conductivity type, the plurality of trenches including a plurality of longitudinal portions that respectively extend in a first direction;
a plurality of first mesa regions respectively provided between a first adjacent two longitudinal portions among the plurality of longitudinal portions that are adjacent in a second direction orthogonal to the first direction;
a plurality of second mesa regions respectively provided between a second adjacent two longitudinal portions among the plurality of longitudinal portions that are adjacent in the second direction; and
a gate electrode embedded in each of the plurality of longitudinal portions via a gate insulating film, wherein
each of the plurality of first mesa regions includes:
  a plurality of first semiconductor regions of the first conductivity type, each first semiconductor region being selectively provided at the first main surface of the semiconductor base and being in contact with the gate insulating film; and
  a semiconductor layer of a second conductivity type that is in contact with the gate insulating film under the plurality of first semiconductor regions, and
each of the plurality of second mesa regions includes:
  a second semiconductor region of the second conductivity type, extending from a bottom of one of the second adjacent two longitudinal portions to a bottom of another of the second adjacent two longitudinal portions,
the semiconductor layer includes a plurality of upper portions thereof that are periodically exposed from the first main surface of the semiconductor base in the first direction, and
on the first main surface, in the first direction, an interval of, among the plurality of upper portions of the semiconductor layer, an adjacent two upper portions that are adjacent in the first direction is greater than a length of each of the plurality of upper portions of the semiconductor layer.

17. The semiconductor device according to claim 16, wherein
the plurality of first mesa regions are provided between an adjacent two second mesa regions among the plurality of second mesa regions that are adjacent in the second direction.

18. The semiconductor device according to claim 16, further comprising
a plurality of bottom regions of the second conductivity type, respectively in contact with bottoms of respective ones of the plurality of longitudinal portions, wherein
the second semiconductor region of each of the plurality of second mesa regions includes a plurality of connecting regions of the second conductivity type that respectively connect the semiconductor layer to the plurality of bottom regions.

19. The semiconductor device according to claim 16, wherein
the plurality of first mesa regions respectively function as a part of a MOS cell region, and
the plurality of second mesa regions respectively function as a part of a diode cell region.

* * * * *